United States Patent
Wong et al.

(10) Patent No.: US 10,461,029 B2
(45) Date of Patent: Oct. 29, 2019

(54) HYBRID MATERIAL ELECTRICALLY PROGRAMMABLE FUSE AND METHODS OF FORMING

(71) Applicant: GLOBALFOUNDRIES INC., Grand Cayman (KY)

(72) Inventors: Chun Yu Wong, Ballston Lake, NY (US); Jagar Singh, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/686,230

(22) Filed: Aug. 25, 2017

(65) Prior Publication Data
US 2019/0067191 A1   Feb. 28, 2019

(51) Int. Cl.
| | | |
|---|---|---|
| H01L 23/525 | (2006.01) | |
| H01L 23/528 | (2006.01) | |
| H01L 21/762 | (2006.01) | |
| H01L 29/161 | (2006.01) | |

(52) U.S. Cl.
CPC ........ *H01L 23/5256* (2013.01); *H01L 21/762* (2013.01); *H01L 21/76224* (2013.01); *H01L 23/528* (2013.01); *H01L 29/161* (2013.01)

(58) Field of Classification Search
CPC ....... H01L 2924/00; H01L 2924/00014; H01L 2224/73265; H01L 2924/00012; H01L 2224/48227
See application file for complete search history.

(56) References Cited

U.S. PATENT DOCUMENTS 7,960,809 B2   6/2011   Kothandaraman et al.
2016/0343659 A1*  11/2016  Hoentschel ......... H01L 23/5256

* cited by examiner

*Primary Examiner* — Tony Tran
(74) *Attorney, Agent, or Firm* — Anthony Canale; Hoffman Warnick LLC

(57) ABSTRACT

Methods of forming a hybrid electrically programmable fuse (e-fuse) structure and the hybrid e-fuse structure are disclosed. In various embodiments, the e-fuse structure includes: a substrate; an insulator layer over the substrate; a pair of contact regions overlying the insulator layer; and a silicide channel overlying the insulator layer and connecting the pair of contact regions, the silicide channel having a first portion including silicide silicon and a second portion coupled with the first portion and on a common level with the first portion, the second portion including silicide silicon germanium (SiGe) or silicide silicon phosphorous (SiP).

9 Claims, 10 Drawing Sheets

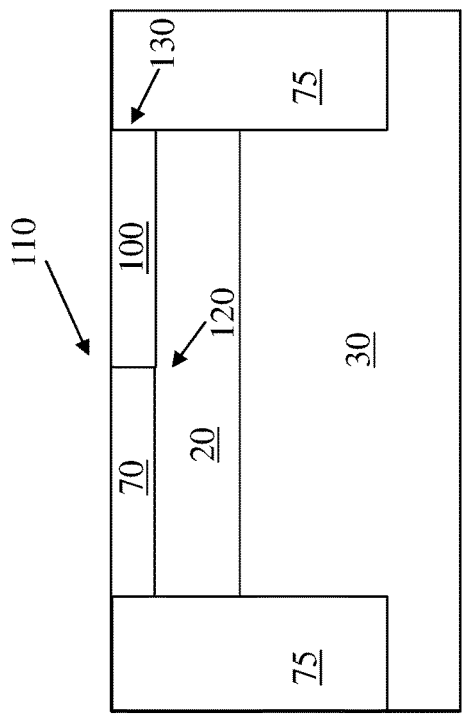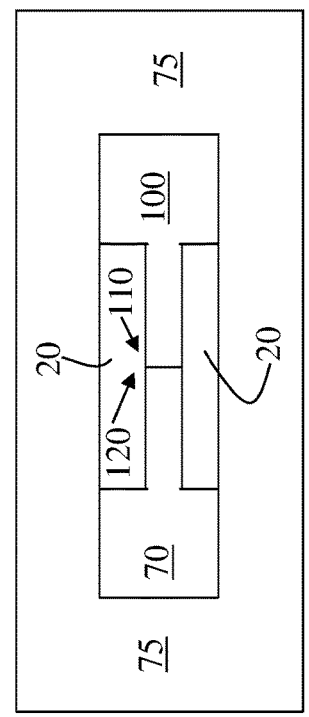
FIG. 5A
FIG. 5B

HYBRID MATERIAL ELECTRICALLY PROGRAMMABLE FUSE AND METHODS OF FORMING

FIELD

The subject matter disclosed herein relates to fuses. More specifically, various aspects described herein relate to a method of forming a programmable fuse and the fuse structure formed thereby.

BACKGROUND

Electrically programmable fuses (or, e-fuses) are conventionally integrated into a semiconductor integrated circuit (IC) as a link (or, strip) of conducting material (e.g. metal, poly-silicon, etc.) between respective terminal access pads. The resistance of the fuse is initially low, and commonly referred to as "closed" in circuit terminology. When a sufficiently large current ($I_{fuse}$) is applied between the first terminal and the second terminal, the metallic elements in the link are electrically migrated away or the link is thermally destroyed, thereby changing the resistance of the e-fuse to a much higher level, commonly referred to as "open" in circuit terminology. This technique is commonly referred to as programming the e-fuse. Determining whether the fuse has been programmed is conventionally performed using a separate sensing circuit.

In advanced technologies, for example, in 20 nanometer nodes and below, e-fuses are commonly formed using back-end-of-line (BEOL) or middle-of-line (MOL) thin metal films or via structures in a standard fin-shaped field effect transistor (FinFET) process flow. These conventional e-fuses utilize a salicide silicon (Si) material (also referred to as self-aligned silicide). This salicide Si is formed entirely of a silicon base material converted to a silicide using a precursor metal and an annealing step. However, this salicide Si requires a high current level to program (or, blow) the e-fuse.

BRIEF SUMMARY

Methods of forming a hybrid electrically programmable fuse (e-fuse) structure and the hybrid e-fuse structure are disclosed. In a first aspect of the disclosure, an e-fuse structure includes: a substrate; an insulator layer over the substrate; a pair of contact regions overlying the insulator layer; and a silicide channel overlying the insulator layer and connecting the pair of contact regions, the silicide channel having a first portion including silicide silicon and a second portion coupled with the first portion and on a common level with the first portion, the second portion including silicide silicon germanium (SiGe) or silicide silicon phosphorous (SiP).

A second aspect of the disclosure includes a method of forming an electrically programmable fuse, the method including: forming a silicon (Si) layer over an insulator layer overlying a substrate; forming a silicon germanium (SiGe) layer adjacent the Si layer over the insulator layer to form a fuse channel; forming a contact region over each of the Si layer and the SiGe layer; and converting a surface of the Si layer, the SiGe layer and the contact regions to silicide.

A third aspect of the disclosure includes an electrically programmable fuse (e-fuse) including: a substrate; an insulator layer over the substrate; a pair of contact regions overlying the insulator layer, wherein the pair of contact regions each include a silicide contact region; and a silicide channel overlying the insulator layer and connecting the pair of contact regions, the silicide channel having a first portion formed approximately entirely of silicide silicon and a second portion coupled with the first portion and on a common level with the first portion, the second portion formed approximately entirely of silicide silicon germanium (SiGe) or silicide silicon phosphorous (SiP).

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 5A shows a side cross-sectional view of the precursor structure of FIG. 4 undergoing additional processes according to various embodiments of the disclosure.

FIG. 5B shows a top view of the precursor structure of FIG. 5A.

Figure 1:
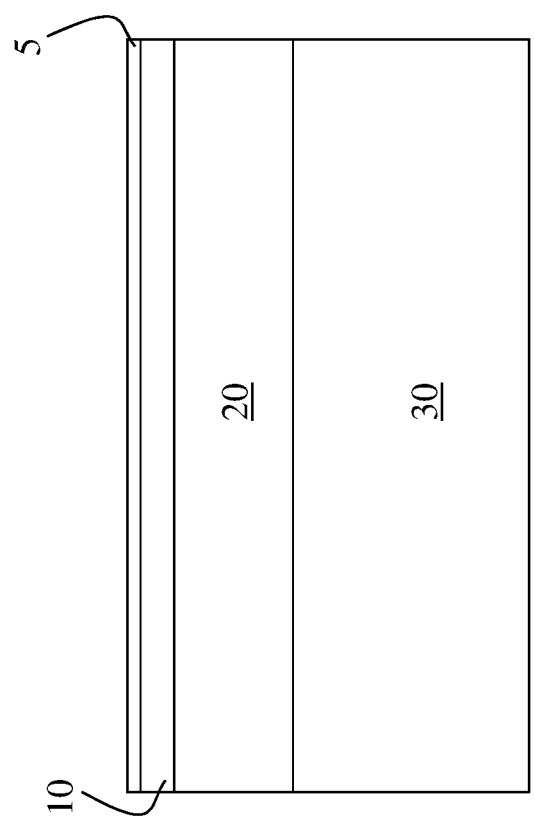
FIG. 1 shows a side cross-sectional view of a precursor structure undergoing processes according to various embodiments of the disclosure.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

The subject matter disclosed herein relates to fuses. More specifically, various aspects described herein relate to a method of forming a programmable fuse with a hybrid material, and the fuse structure formed thereby.

As noted herein conventional e-fuses utilize a salicide (self-aligned silicide) silicon (Si) material, which requires a high current level to program (or, blow) the e-fuse. In contrast to these conventional devices, various aspects of the disclosure include an e-fuse structure having a base formed entirely of a salicide (self-aligned silicide) hybrid material (e.g., a fully silicon germanium (SiGe) layer or silicide silicon phosphorous (SiP) layer and a Si layer) in the silicon-on-insulator (SOI) layer with an overlying salicide on the e-fuse channel. The salicided SiGe (or SiP) has a lower melting point than salicide Si, which reduces the amount of current needed to program the e-fuse when compared with conventional e-fuse devices. The hybrid e-fuse structure can be tailored to program (or, blow) at a specific location due to the higher level of temperature control when compared with conventional e-fuse devices. This hybrid e-fuse structure can also have a higher ON/OFF ratio than conventional e-fuse devices, along with a larger programming window. The larger programming window can provide for greater manufacturing yield when compared with conventional e-fuse structures. In some cases, a higher ON/OFF ratio can provide greater device performance, e.g., a more effective fuse. Further, the process of forming this hybrid e-fuse structure may be more efficient than conventional processes, for example, requiring fewer masking processes in forming the SOI layer.

FIGS. 1-8B are depictions of precursor structures which illustrate processes in forming an e-fuse structure (FIGS. 9A and 9B) according to various embodiments of the disclosure. It is understood that the processes described herein and shown in the accompanying FIGURES are not intended to limit the e-fuse structures formed according to the various aspects of the disclosure. That is, as noted herein, other e-fuse structures having properties according to aspects of the disclosure may be formed by methods which deviate from the method shown in FIGS. 1-9B. For example, as noted herein, the silicide channel formed according to various embodiments of the disclosure could include distinct materials (e.g., SiGe or SiP) that each provide for benefits relative to conventional e-fuse structures.

FIG. 1 shows a side cross-sectional depiction of a precursor structure including a native oxide 5, over a silicon-on-insulator (SOI) layer 10, overlying an insulator layer 20, overlying a substrate 30. It is understood that substrate 30 can include any conventional substrate materials, e.g., silicon, germanium, silicon germanium, silicon carbide, and those consisting essentially of one or more III-V compound semiconductors having a composition defined by the formula AlX1GaX2InX3AsY1PY2NY3SbY4, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition ZnA1CdA2SeB1TeB2, where A1, A2, B1, and B2 are relative proportions each greater than or equal to zero and A1+A2+B1+B2=1 (1 being a total mole quantity). In the example of a silicon-on-insulator (SOI) substrate, substrate 30 can be non-conductive material such as sapphire, etc. In other embodiments, substrate 30 can include a bulk silicon substrate.

As used herein, "depositing" may include any now known or later developed techniques appropriate for the material to be deposited including but are not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

In various embodiments, insulator layer 20 can include a conventional insulator material such as an oxide (e.g., silicon dioxide ($SiO_2$)) or any conventional low-k dielectric insulator material. In some particular embodiments, insulator layer 20 can include a buried oxide ($BO_x$) layer formed of an oxide, e.g., of $SiO_2$. Insulator layer 20 can be deposited or otherwise conventionally formed over substrate 30. Native oxide 5 can similarly include an oxide such as any material suitable for insulator layer 20, e.g., $SiO_2$. SOI layer 10 can include any conventional silicon-on-insulator material, including, e.g., a silicon (Si) layer overlying an insulator (e.g., insulator 20). That is, according to various embodiments, SOI layer 10 may be formed nearly entirely, or entirely, of Si. SOI layer 10 can be deposited or otherwise conventionally formed over insulator 20, and native oxide 5 may be similarly deposited or formed over SOI layer 10.

Figure 2:
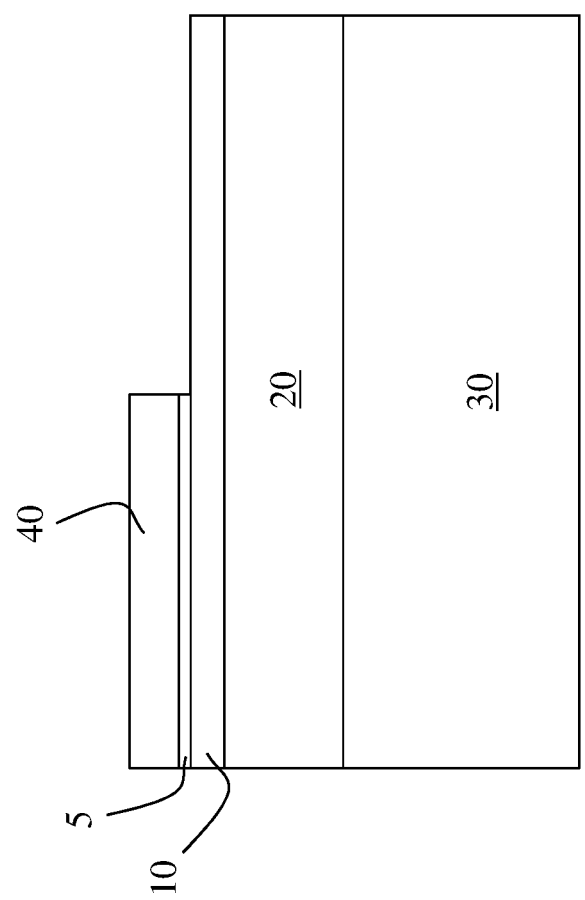
FIG. 2 shows a side cross-sectional view of the precursor structure of FIG. 1 undergoing additional processes according to various embodiments of the disclosure.

FIG. 2 illustrates a process performed on the precursor structure of FIG. 1, including forming a mask 40 over native oxide 5 and SOI layer 10. In some cases, mask 40 includes a hard mask, such as a nitride hard mask, and may be deposited over native oxide 5 (directly), SOI layer 10 and insulator 20 according to any deposition approach described herein. Additionally shown in FIG. 2, native oxide 5 overlying a portion of SOI layer 10 is etched using mask 40, to expose a portion of SOI layer 10. In some cases, lithography and/or reactive ion etching (RIE) processes can be used to form the opening in native oxide 5 and expose the portion of SOI layer 10.

Figure 3:
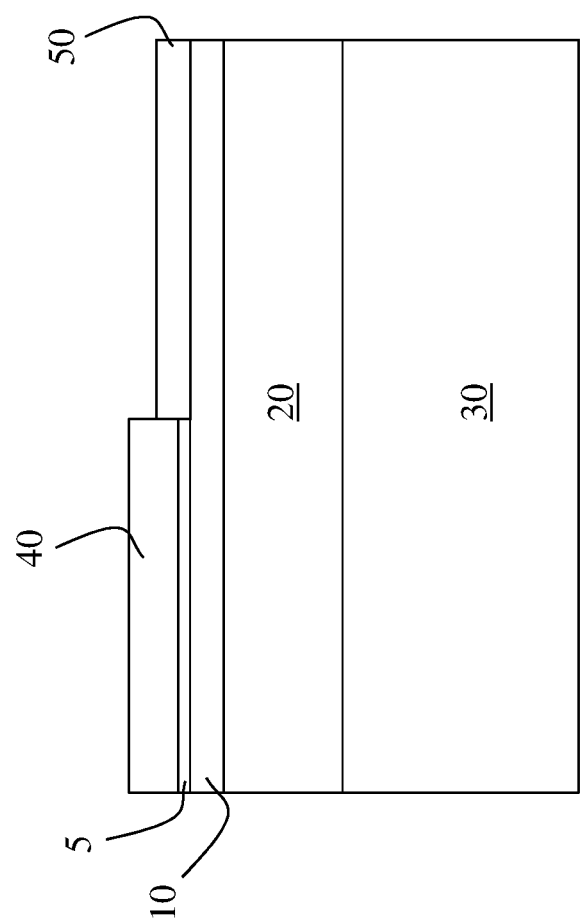
FIG. 3 shows a side cross-sectional view of the precursor structure of FIG. 2 undergoing additional processes according to various embodiments of the disclosure.

FIG. 3 illustrates an additional process of forming a silicon germanium (SiGe) layer 50 over the exposed portion of SOI layer 10 (after masking and etching shown in FIG. 2). In some cases, SiGe layer 50 can be grown, e.g., epitaxially grown, over SOI layer 10, according to conventional approaches. In various embodiments, SiGe layer 50 can be grown while mask 40 remains in place over a distinct portion of SOI layer 10. In some cases, after forming SiGe layer 50, mask 40 is removed, e.g., via a conventional acid wash or etching technique.

Figure 4:
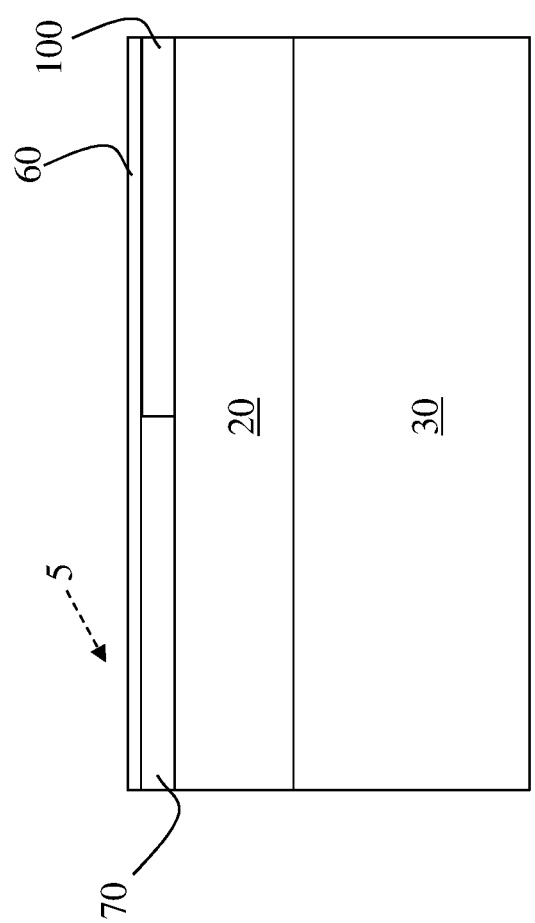
FIG. 4 shows a side cross-sectional view of the precursor structure of FIG. 3 undergoing additional processes according to various embodiments of the disclosure.
Figure 6:
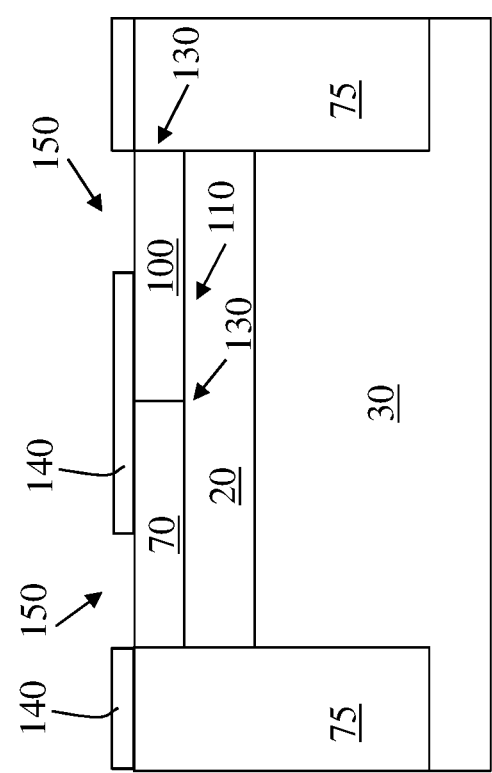
FIG. 6 shows a side cross-sectional view of the precursor structure of FIG. 5A undergoing additional processes according to various embodiments of the disclosure.

FIG. 4 illustrates a condensation-by-oxidation process performed on the precursor structure of FIG. 3 (after removal of mask 40), which causes the germanium in the SiGe layer 50 (FIG. 3) to transfer into the underlying silicon in the SOI layer 10 (FIG. 3). As shown in FIG. 4, after oxidation, a native oxide 60 is left overlying a silicon layer 70 (originally SOI layer 10), and adjacent silicon layer 70 is a SiGe layer 100, which is a modified SOI layer 10 with the transferred germanium from now-removed SiGe layer 50. It is understood that a portion of native oxide 60 can include the originally formed native oxide 5, which was previously covered by mask 40 (FIG. 3, and also illustrated in phantom in FIG. 4). While a seam is not shown in this depiction, it is understood that a seam may exist between previously formed native oxide 5 and later-formed native oxide 60 (e.g., overlying the seam shown between silicon layer 70 and SiGe layer 100).

FIGS. 5A and 5B show an additional process of removing native oxide 60 (including native oxide 5), e.g., using a conventional lithography and etching process described herein, and preliminary e-fuse structure formation (e.g., forming shallow trench isolations (STI) 75) around substrate 30 via masking and deposition of a dielectric material (e.g., silicon dioxide or other conventional STI materials), and shaping of Si layer 70 and SiGe layer 100 using conventional lithography to form a precursor e-fuse shape (FIG. 5B)). As shown in FIGS. 5A and 5B, Si layer 70 abuts SiGe layer 100 in a channel 110 overlying insulator layer 20 (and surrounded by STI 75), forming an interface 120. In some particular cases, Si layer 70 directly contacts SiGe layer 100 in channel 110. In various embodiments, Si layer 70 and SiGe layer 100 are formed on a common level 130 overlying insulator layer 20, such that the upper and lower surfaces of each of Si layer 70 and SiGe layer 100 are substantially (e.g., +/− margin of measurement error) coplanar. In some cases, channel 110 overlying insulator layer 20 is filled approximately entirely with Si layer 70 and SiGe layer 100 (e.g., allowing for impurities of up to 1% of total composition).

In various embodiments (shown in FIG. 6), following formation of channel 110 including Si layer 70 and adjacent SiGe layer 100, an additional mask 140 can be selectively formed over portions of insulator layer 20, STI 75, Si layer 70 and SiGe layer 100. In some cases, mask 140 can include a hard mask, e.g., a conventional hard mask as described herein and/or known in the art. In some particular embodiments, mask 140 can include a nitride hard mask. In various embodiments, mask 140 can be deposited, e.g., blanket deposited (or otherwise formed) over insulator layer 20, STI 75, Si layer 70 and SiGe layer 100, and conventional lithography and etching processes can be used to form openings 150 overlying portions of Si layer 70 and SiGe layer 100. In some cases, RIE can be used to selectively form openings 150.

Figure 7:
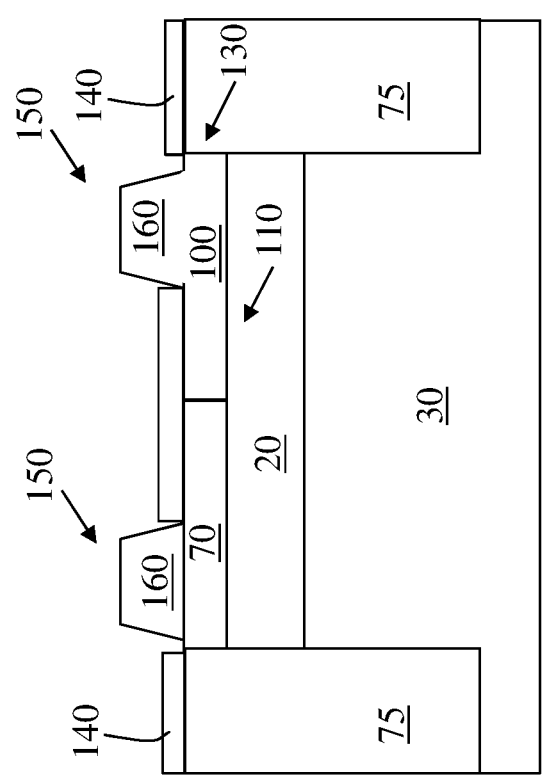
FIG. 7 shows a side cross-sectional view of the precursor structure of FIG. 6 undergoing additional processes according to various embodiments of the disclosure.

FIG. 7 shows an additional process of forming a pair of contact regions (e.g., SiGe contact regions or Si contact regions) 160 over insulator layer 20 and each of Si layer 70 and SiGe layer 100 (e.g., directly contacting Si layer 70 and SiGe layer 100). In some cases, a seed SiGe layer or a seed Si layer can be formed (e.g., deposited) over Si layer 70 and SiGe layer 100, and can be epitaxially grown to form two distinct contact regions 160. Contact regions (e.g., Si or SiGe contact regions) 160 can overly, and in various embodiments, directly contact Si layer 70 and SiGe layer 100, respectively. It is understood that no line is shown between SiGe layer 100 and contact region 160 which overlies that SiGe layer 100 because these portions of the device are formed of the same material, however, a seam may exist between these sections which have been formed in distinct processes.

Figure 8A:
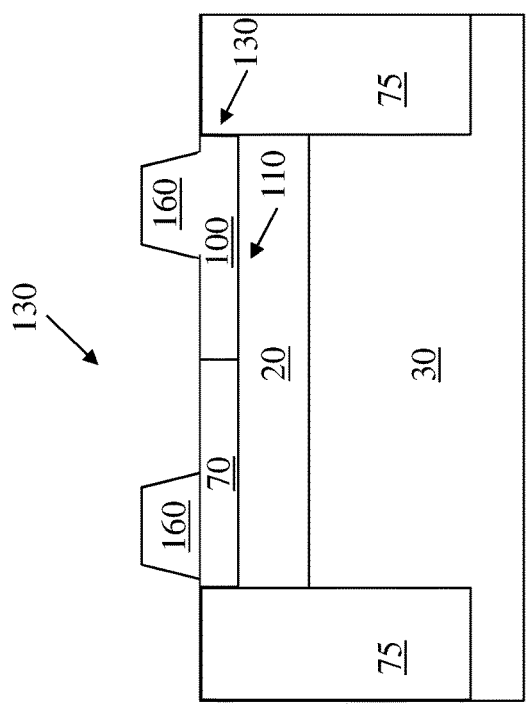
FIG. 8A shows a side cross-sectional view of the precursor structure of FIG. 7 undergoing additional processes according to various embodiments of the disclosure.
Figure 8B:
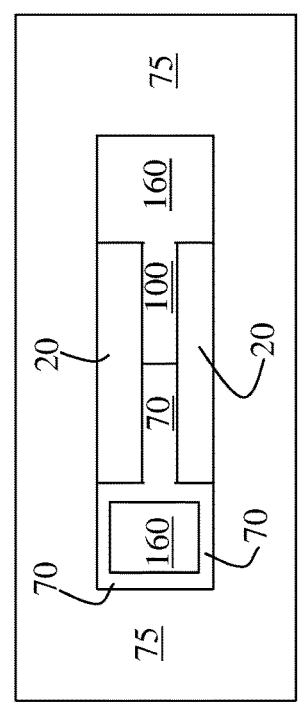
FIG. 8B shows a top view of the precursor structure of FIG. 8A.

Following formation of contact regions 160 (FIG. 7), mask 140 can be removed (as shown in FIGS. 8A and 8B), e.g., via conventional etching, bath and/or acid wash techniques described herein and/or known in the art. For example, where mask 140 includes a nitride hard mask, mask 140 can be removed by an acid wash process.

Figure 9A:
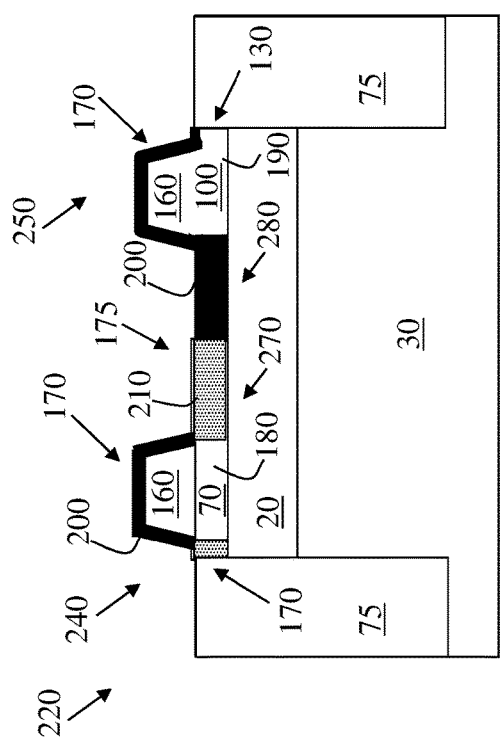
FIG. 9A shows a side cross-sectional view of an electrically programmable fuse (e-fuse) structure according to various embodiments of the disclosure.
Figure 9B:
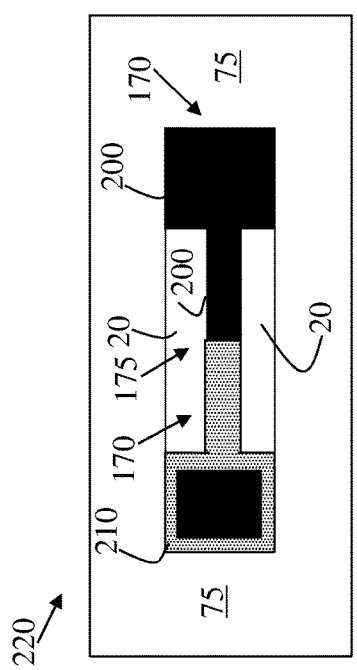
FIG. 9B shows a top view of the e-fuse structure of FIG. 9A.

After removal of mask 140, as shown in FIGS. 9A and 9B, the surfaces of Si layer 70, SiGe layer 100 and contact regions 160 can be converted to silicide 170. That is, according to various embodiments, a precursor metal (e.g., nickel or other metal such as titanium, cobalt, aluminum, etc.) is deposited over the exposed surfaces of Si layer 70, SiGe layer 100 and contact regions 160, and that precursor metal is annealed to convert the precursor metal to silicide 170. Annealing can be performed according to a conventional annealing process used to heat the silicide precursor metal and portions of the underlying Si layer 70, SiGe layer 100 and contact regions 160, allowing for material transformation between these layers. This annealing causes the exposed surfaces of the underlying layers to become silicide 170 (e.g., silicide Si or silicide SiGe), that is, to take on some of the metallic/conductive properties of the overlying silicide precursor metal.

In various embodiments, the silicide precursor metal can be removed via a conventional washing technique, e.g., an aqua regia bath, to leave silicide 170 over desired regions. In various embodiments, due to the presence of oxide in insulator layer 20 and STI 75, silicide 170 can be selectively formed over Si layer 70, SiGe layer 100 and contact regions 160, without requiring an intervening lithography process. That is, silicide 170 can be formed after contact regions 160 are formed without the need for a lithography process (e.g., masking and/or etching process) prior to depositing the silicide precursor metal and converting that silicide precursor metal to silicide. Because the oxide in insulator layer 20 and STI prevents formation of silicide 170 over those layers, the silicide precursor metal can be blanket deposited over insulator layer 20, STI 75, Si layer 70, SiGe layer 100 and contact regions 160 and effectively removed using a conventional washing technique to leave only the desired silicide 170 on Si layer 70, SiGe layer 100 and contact regions 160. This self-aligned silicide 170 (or, salicide) can simplify the manufacturing process relative to conventional formation of silicide that is not self-aligned. As is illustrated in FIGS. 9A and 9B, a portion 180 of Si layer 70 underlying one of contact regions 160 and a portion 190 of SiGe layer 100 underlying another one of the contact regions 160 is not converted to silicide 170 during the silicide formation process discussed herein. That is, as is known in the art, the silicide conversion process converts only the surface region of these underlying layers to silicide. The thickness of the underlying layer which is converted to silicon can vary, as is known in the art, according to the thickness of the precursor layer as well as the environmental conditions such as temperature and pressure at which silicide is formed.

As shown in FIGS. 9A and 9B, silicide 170 can include a silicide channel 175 over insulator layer 20 (directly contacting insulator layer 20) and connecting contact regions 160. Silicide channel 175 can have distinct types of silicide, based upon the underlying material which is converted. In particular, silicide 170 can include a silicide SiGe (or, salicide SiGe) 200, and a silicide Si (or, salicide Si) 210. In particular cases, as described herein, silicide channel 175 can consist approximately entirely of silicide SiGe 200 and silicide Si 210. That is, silicide SiGe 200 (shown in black) and silicide Si (shown in stippling) can be formed approximately entirely from silicide formation of these base layers.

Figure 10:
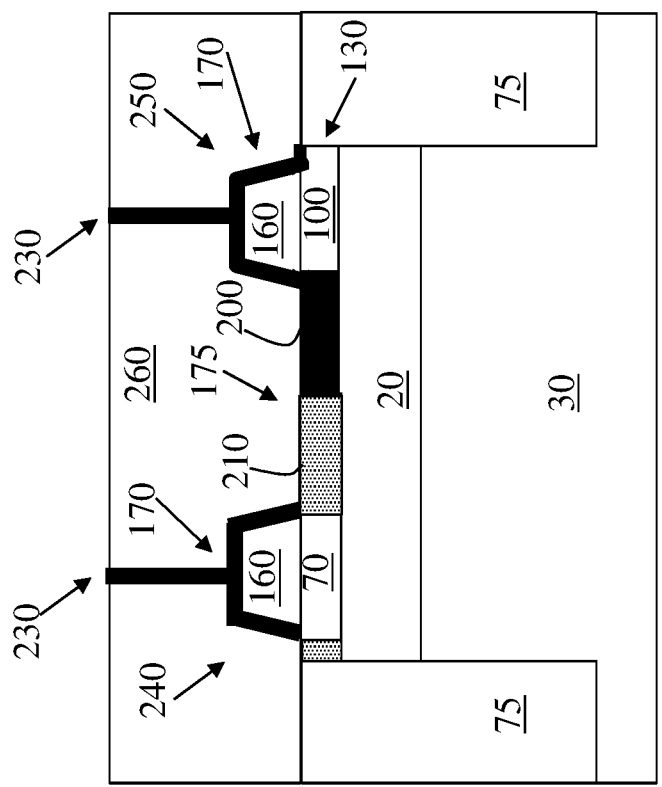
FIG. 10 shows a side cross-sectional view of another embodiment of an e-fuse structure including additional contacts.

FIGS. 9A and 9B illustrate an e-fuse 220 formed according to various approaches described herein. In some additional embodiments, as illustrated in FIG. 10, another optional process can include forming a contact 230 to at least one of the contact regions 160, which may include a first terminal 240 or a second terminal 250. Contact 230 can be formed by conventional masking and deposition processes, including depositing a dielectric layer over e-fuse 220 (FIGS. 9A, 9B), forming a mask over that dielectric, etching the mask to form openings corresponding with contact 230, etching into the dielectric layer using the mask, filling openings in the dielectric layer with a conductive material such as copper, tungsten, etc., and removing the mask to leave contacts 230 which contact the silicide 170 over contact regions 160.

However, it is understood that according to various embodiments, e-fuse 220 may not necessarily be formed including contact(s) 230. For example, referring back to FIGS. 9A and 9B, according to various embodiments, e-fuse 220 can include: substrate 30, insulator layer 20 over substrate 30, and a pair of contact regions 160 over insulator layer 20. As described herein, silicide channel 175 overlies insulator layer 20 and connects contact regions 160 (electrically connects these regions). Silicide channel 175 can have a first portion 270 including silicide Si 210 and a second portion 280, coupled (electrically) with first portion 270 on common level 130, including silicide SiGe (or silicide SiP, as described herein) 200. In particular cases, as noted herein, first portion 270 is formed approximately entirely of silicide Si 210 and second portion 280 is formed approximately entirely of silicide SiGe 200. In various embodiments, silicide channel 175 forms a continuous contact channel between first terminal 240 and second terminal 250 (e.g., silicide 170 over respective contact regions 160).

While the example method shown herein may allow for formation of an e-fuse (e.g., e-fuse 220) with various benefits when compared with conventional fuses, it is understood that additional methods could be used to form similar e-fuse structures within the teachings of the various embodiments. That is, according to various particular embodiments and with reference to the e-fuse structure 220 of FIGS. 9A and 9B, the second portion 280 of silicide channel 175 could include silicide silicon phosphorous (SiP) according to various additional embodiments. In these cases, SiP could replace SiGe in this second portion 280 of silicide channel 175 (and may replace SiGe in other areas shown and described with reference to e-fuse 220). In these alternative embodiments, SiP could be deposited in an opening within insulator layer 20 sized to accommodate a portion of the e-fuse structure, and could undergo similar silicide processing described with respect to FIGS. 9A and 9B. It is further understood that other methods and alternative silicide structures can be formed as part of silicide channel 175 to achieve various functions of the e-fuse structures described herein.

It is understood that the processes shown and described herein are merely illustrative processes which can be performed in conjunction with one another, or with other processes described herein.

In any case, as described herein, various aspects of the disclosure enable the formation of improved e-fuses (e.g., e-fuse 220) which can be more readily and reliably programmed when compared with the conventional e-fuse. The e-fuse (e.g., e-fuse 220) and related methods described herein have a hybrid material silicide link that is designed to improve device performance. The e-fuse (e.g., e-fuse 220) can be tailored to program at a specific location due to the higher level of temperature control when compared with conventional e-fuses. This e-fuse (e.g., e-fuse 220) can also have a higher ON/OFF ratio than conventional e-fuse devices, along with a larger programming window. Further, the process of forming this hybrid e-fuse (e.g., e-fuse 220) may be more efficient than conventional processes, for example, requiring fewer masking processes in forming the SOI.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. An electrically programmable fuse (e-fuse) comprising:
 a substrate;
 an insulator layer over the substrate;
 a pair of contact regions overlying the insulator layer; and
 a silicide channel overlying the insulator layer and connecting the pair of contact regions, the silicide channel having a first portion including silicide silicon and a second portion coupled with the first portion and on a common level with the first portion, the second portion including silicide silicon germanium (SiGe) or silicide silicon phosphorous (SiP), wherein the first portion has an upper surface and a lower surface and the second portion has an upper surface and a lower surface, wherein the upper surface of the first portion is coplanar with the upper surface of the second portion and the lower surface of the first portion is coplanar with the lower surface of the second portion;
 wherein a first one of the pair of contact regions includes a silicon layer on the common level with the first portion of the silicide channel and the second portion of the silicide channel, and a second one of the pair of contact regions includes a SiGe layer on the common level with the second portion of the silicide channel and the first portion of the silicide channel;
 wherein the first portion is formed entirely of the silicide Si and the second portion is formed entirely of the silicide SiGe or the silicide SiP; and
 wherein an upper surface of the silicon layer of the first one of the pair of contact regions is coplanar with an upper surface of the SiGe layer of the second one of the pair of contact regions.

2. The e-fuse of claim 1, wherein the pair of contact regions each include a silicide contact region.

3. The e-fuse of claim 1, wherein the first one of the pair of contact regions further includes a SiGe layer over the silicon layer, and a silicide SiGe layer over the SiGe layer.

4. The e-fuse of claim 1, wherein the second one of the pair of contact regions includes a silicide SiGe layer over the SiGe layer.

5. The e-fuse of claim 1, wherein the pair of contact regions include a first terminal and a second terminal.

6. The e-fuse of claim 1, wherein the substrate includes a bulk silicon substrate.

7. An electrically programmable fuse (e-fuse) comprising:
 a substrate;
 an insulator layer over the substrate;
 a pair of contact regions overlying the insulator layer, wherein the pair of contact regions each include a silicide contact region; and
 a silicide channel overlying the insulator layer and connecting the pair of contact regions, the silicide channel having a first portion formed entirely of silicide silicon and a second portion coupled with the first portion and on a common level with the first portion, the second portion formed entirely of silicide silicon germanium (SiGe), wherein the first portion has an upper surface and a lower surface and the second portion has an upper surface and a lower surface, wherein the upper surface of the first portion is coplanar with the upper surface of the second portion and the lower surface of the first portion is coplanar with the lower surface of the second portion;

wherein a first one of the pair of contact regions includes a silicon layer on the common level with the first portion of the silicide channel and the second portion of the silicide channel, and a second one of the pair of contact regions includes a SiGe layer on the common level with the second portion of the silicide channel and the first portion of the silicide channel; and wherein an upper surface of the silicon layer of the first one of the pair of contact regions is coplanar with an upper surface of the SiGe layer of the second one of the pair of contact regions.

8. The e-fuse of claim 7, wherein the first one of the pair of contact regions further includes a SiGe layer over the silicon layer, and a silicide SiGe layer over the SiGe layer, wherein the second one of the pair of contact regions includes a silicide SiGe layer over the SiGe layer.

9. The e-fuse of claim 7, wherein the substrate includes a bulk silicon substrate.

* * * * *